United States Patent [19]

Sato et al.

[11] Patent Number: 4,860,361
[45] Date of Patent: Aug. 22, 1989

[54] ACOUSTIC-DEVICE COOLING UNIT

[75] Inventors: Takeshi Sato; Hiroo Adachi; Shigeru Munetomo, all of Saitama, Japan

[73] Assignee: Pioneer Electronic Corporation, Tokyo, Japan

[21] Appl. No.: 239,731

[22] Filed: Sep. 2, 1988

[30] Foreign Application Priority Data

Sep. 2, 1987 [JP] Japan .......................... 62-134997[U]

[51] Int. Cl.$^4$ .......................................... H03G 11/00
[52] U.S. Cl. ....................................... 381/55; 381/59
[58] Field of Search ................... 318/460; 381/56, 59, 381/96, 55, 57, 58

[56] References Cited

U.S. PATENT DOCUMENTS 3,195,034  7/1965  Bensema .............................. 318/460
4,267,500  5/1981  Bourke et al. ....................... 318/806

Primary Examiner—Forester W. Isen
Attorney, Agent, or Firm—Sughrue, Mion, Zinn, Macpeak & Seas

[57] ABSTRACT

A cooling unit for cooling an acoustic device installed on the vehicle by using a cooling fan comprises a cooling fan drive circuit which outputs a DC voltage proportional to the input or output signal level of the acoustic device to control the speed of rotation of the cooling fan motor, whereby the noise of the cooling fan is suppressed in a sense of hearing when no signal is provided by the acoustic device.

4 Claims, 1 Drawing Sheet

ACOUSTIC-DEVICE COOLING UNIT

BACKGROUND OF THE INVENTION

This invention relates to a cooling unit for acoustic devices a typical example of which is a power amplifier, and more particular to a cooling unit for acoustic devices which can effectively suppress noises produced by a cooling fan.

Recently, acoustic devices have been improved not only in performance but also in output, and high power amplifiers are provided with a cooling fan as forcible cooling means. This tendency is significant with acoustic devices installed on vehicles.

For instance, as shown in FIG. 1, in order to cool a power amplifer 1, an electric motor 2 for driving a cooling fan is connected to a cooling fan circuit 3 having a cooling fan drive power source 3A, and the input terminal 1A of the power amplifier 1 is connected to the output terminal of a reproducing device (or player) or the like whereas the output terminal 1B is connected to a loudspeaker 4. Thus, during operation of the power amplifier, the cooling fan driven by the motor 2 supplies cooling air to the power amplifier 1 to cool the latter.

In the above-described cooling unit, the cooling fan is operated independently of the level of the input or output signal of the power amplifier 1; in other words, the cooling fan supplies air to the power amplifier 1 at a certain flow rate corresponding to the maximum amount of heat generated by the power amplifier 1 to cool the latter 1. Therefore, when the output level is low for instance in the case where the operation of the music source is suspended or the reproduction comes between pieces of music, or a pause period occurs in the reproduction, the air cutting sound or vibration of the cooling fan becomes conspicuous inside the vehicle, thus causing the operator to feel disagreeable with it.

SUMMARY OF THE INVENTION

In view of the foregoing, an object of this invention is to provide a cooling unit for acoustic device in which the noise or vibration of the cooling fan is suppressed, so that the operator can drive the vehicle more comfortably.

The foregoing object and other objects of the invention have been achieved by the provision of a cooling unit for an acoustic device which, according to the invention, comprises: a cooling fan drive circuit for outputting a DC voltage corresponding to an input or output signal level of the acoustic device; and a cooling fan motor which is driven by the output DC voltage of the cooling fan drive circuit.

The nature, principle and utility of the invention will become more apparent from the following detailed description when read in conjunction with the accompanying drawings.

DETAILED DESCRIPTION OF THE INVENTION

Figure 1:
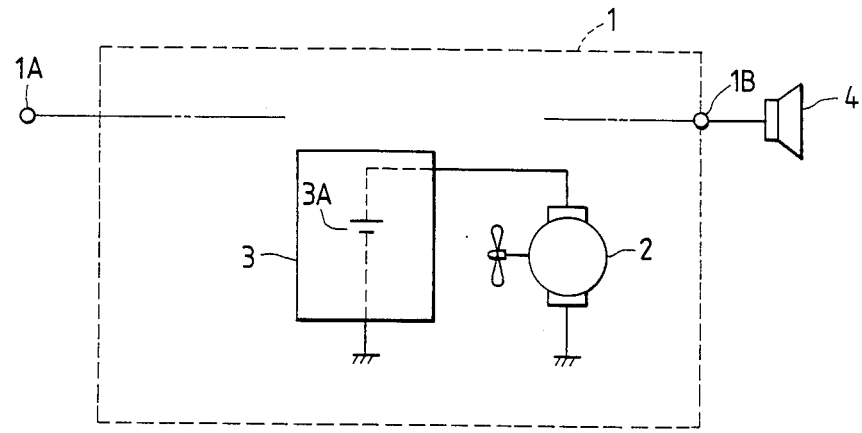
FIG. 1 is an explanatory diagram, partly as a block diagram, showing a conventional cooling unit for an acoustic device.

One example of a cooling unit for acoustic devices according to this invention will be described with reference to FIG. 2, in which those components which have been previously described with reference to FIG. 1 are therefore designated by the same reference numerals or characters.

Figure 2:
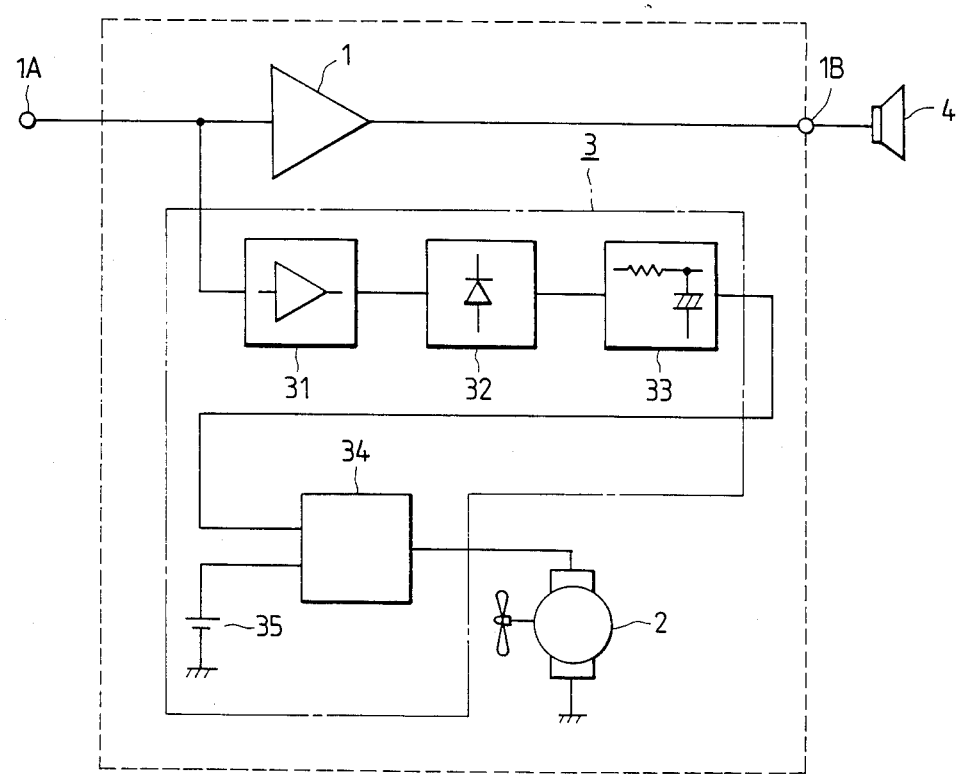
FIG. 2 is an explanatory diagram, partly as a block diagram, showing one example of a cooling unit for an acoustic device according to this invention.

As shown in FIG. 2, part of an audio signal applied to the input terminal 1A of the power amplifier 1 is supplied to a cooling fan drive circuit 3, so that the output of the latter 3 drives the electric motor 2 of the cooling fan. The cooling fan drive circuit 3 comprises: an amplifier 31 for amplifying the part of the audio signal (applied to the power amplifier 1); a rectifier circuit 32 connected to the amplifier 31; a smoothing circuit 33 connected to the rectifier circuit 32; and an addition circuit 34 connected to the smoothing circuit 33. A voltage source 35 for providing a set voltage when no input signal is available is connected to the addition circuit 34.

The part of the audio signal is amplified by the amplifier 31, rectified by the rectifier circuit 32, and smoothed by the smoothing circuit 33, the output DC voltage of which is applied to the addition circuit 34, where it is added to the voltage set by the voltage source 35 to provide a superposition voltage. The superposition voltage is applied to the motor 2 to drive the cooling fan. Therefore, if the level of the audio signal is high, the cooling fan is rotated at high speed; and if the level is low, the cooling fan is rotated at low speed; that is, the speed of rotation of the cooling fan is increased with the level of the audio signal.

In the above-described cooling unit, the cooling fan is driven even when no audio signal is available. However, the cooling unit may be so modified that, when no signal is available, the motor 2 is stopped. In the modification, the addition circuit 34 and the voltage source 35 may be eliminated, and the output voltage of the smoothing circuit 33 can be applied directly to the motor 2 of the cooling fan.

Furthermore, the cooling fan drive circuit 3 may be so modified that it outputs a DC voltage corresponding to the output signal level of the power amplifier 1.

As is apparent from the above description, with the cooling unit for acoustic devices according to the invention, the flow rate of cooling air supplied to a heat generating acoustic device such as a power amplifier is determined according to the signal level of the acoustic device. Therefore, when no signal is available, the noise of the cooling fan is lowered; and when the signal level is high, the noise is substantially masked by reproduced musical sounds or the like, and reproduced sounds can be enjoyed comfortably.

What is claimed is:

1. A cooling unit for cooling an acoustic device with a cooling fan, which comprises:
   a cooling fan drive circuit for outputting a DC voltage corresponding to an input or output signal level of said acoustic device; and
   a cooling fan motor which is driven by the DC voltage provided by said cooling fan drive circuit.

2. A cooling unit as claimed in claim 1, in which said cooling fan drive circuit outputs a DC voltage corresponding to an input signal level of said acoustic device.

3. A cooling unit as claimed in claim 2, in which said cooling fan drive circuit comprises:

an amplifier for amplifying part of an input signal of said acoustic device;
a rectifier circuit for rectifying an output of said amplifier; and
a smoothing circuit for smoothing an output of said rectifier circuit.

4. A cooling unit as claimed in claim 3, in which said cooling fan drive circuit further comprises;
a DC voltage source; and
an addition circuit for adding the output DC voltage of said DC voltage source to an output of said smoothing circuit.

* * * * *